United States Patent [19]

Hardee

[11] Patent Number: 4,486,944
[45] Date of Patent: Dec. 11, 1984

[54] METHOD OF MAKING SINGLE POLY MEMORY CELL

[75] Inventor: Kim C. Hardee, Manitou Springs, Colo.

[73] Assignee: Inmos Corporation, Colorado Springs

[21] Appl. No.: 485,732

[22] Filed: Apr. 18, 1983

Related U.S. Application Data

[62] Division of Ser. No. 164,285, Jun. 20, 1980.

[51] Int. Cl.$^3$ ............................................. H01L 21/80
[52] U.S. Cl. ..................................... 29/577 C; 29/571; 29/578
[58] Field of Search ...................... 29/571, 577 C, 578, 29/591; 357/41, 233, 51, 54

[56] References Cited

U.S. PATENT DOCUMENTS

| 4,110,776 | 8/1978 | Rao et al. | 357/51 |
| 4,207,585 | 6/1980 | Rao | 357/59 |
| 4,240,097 | 12/1980 | Raymond, Jr. | 357/59 |
| 4,246,593 | 1/1981 | Bartlett | 357/41 |

Primary Examiner—Aaron Weisstuch
Assistant Examiner—Hunter L. Auyang
Attorney, Agent, or Firm—Edward D. Manzo

[57] ABSTRACT

A single polycrystalline silicon configuration for a memory cell in a static MOS RAM and a method of fabricating the same are described. Three conductivity regions are utilized to form each memory cell. A first conductivity region is formed in the substrate to create a buried ground line and sources and drains of transistors. A second conductivity region is formed within an insulation layer and above the first conductivity region to create a word line, gate regions of the transistors, load resistors, and a power supply line. The power supply line is oriented directly above and parallel to the ground line. A third conductivity region is formed on the surface of the insulation layer to create data lines. The number of process steps and the size of the memory cell are reduced by this configuration.

8 Claims, 6 Drawing Figures

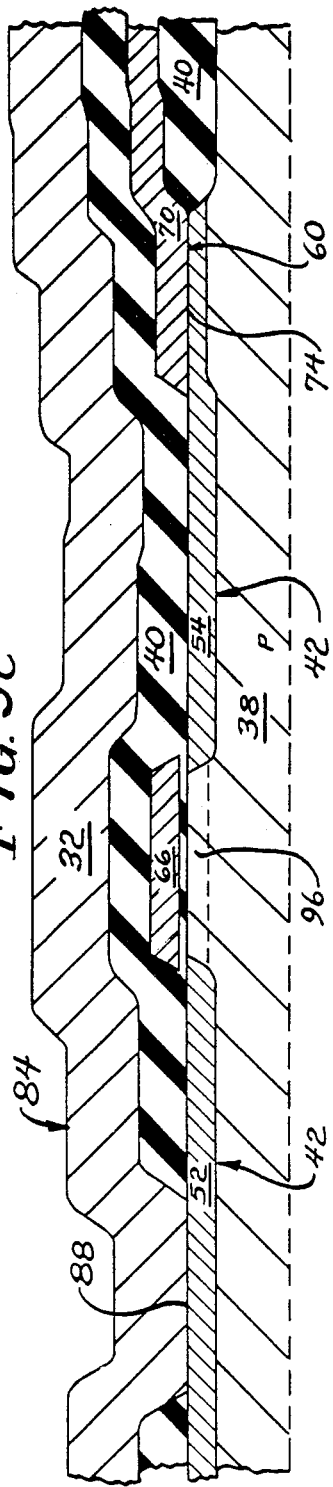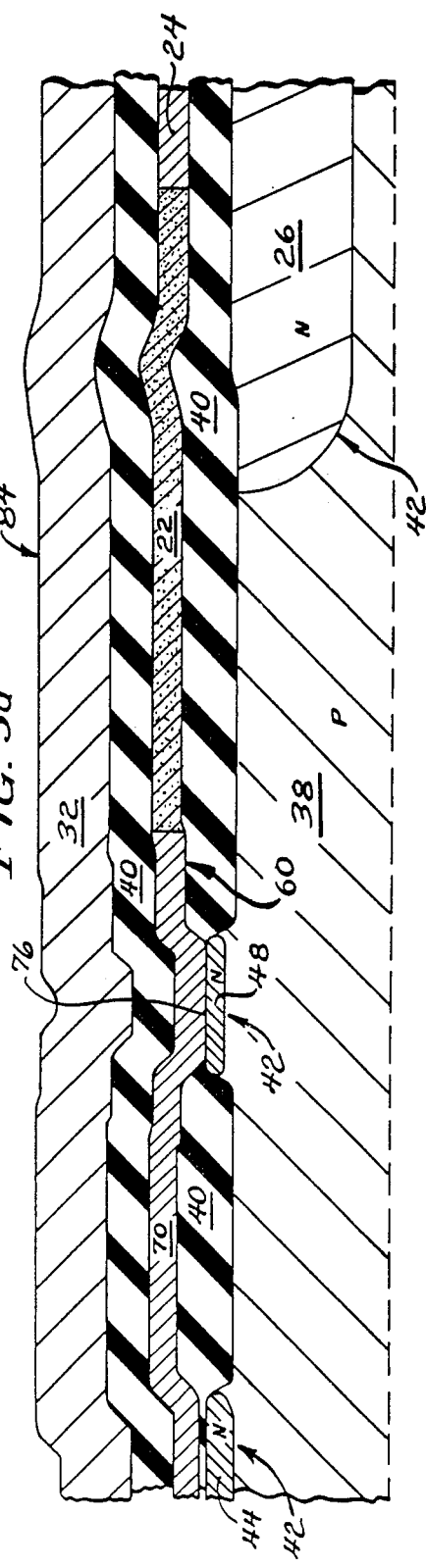

METHOD OF MAKING SINGLE POLY MEMORY CELL

This application is a division, of application Ser. No. 164,285, filed June 20, 1980.

BACKGROUND OF THE INVENTION

The invention relates to the field of metaloxide-semiconductor (MOS) configurations for MOS random access memories (RAMs) and, more particularly, to a memory cell configuration for static MOS RAMs.

Static MOS RAMs typically employ bistable, flip-flop circuits as memory cells for storing binary data. One particularly useful flip-flop circuit configured from four transistors and two resistor loads is frequently utilized in various memory cell structures because of its small size and low power requirements.

Conventionally, memory cells are fabricated with a single polycrystalline silicon (polysilicon) layer combined with an aluminum layer for forming transistors as well as interconnects in each memory cell. In particular, the aluminum layer is utilized for a power supply (Vcc) interconnect, a ground line (Vss) interconnect, and data line interconnects. While functioning adequately, the metal interconnects take up valuable space on a processed silicon wafer because all critical interconnect levels are in the same plane. This results in a smaller yield per wafer. The yield problem has been, in part, overcome by connecting the resistor loads to the bit lines which extend through the cell for accessing the cell, thereby eliminating the metal line for the Vcc connection and, thus, making the cell size smaller. More recently, the cell size has been further reduced by introducing a second polysilicon layer into the cell. The second polysilicon layer is used to form both the Vcc interconnect and the load resistors while an aluminum layer is used as a data line interconnect. An N+ diffusion silicon layer is used for the Vss interconnect.

Although the memory cell has diminished in size due to the layered levels, other yield problems are precipitated by the double polysilicon configuration. One problem area occurs from the second polysilicon layer intersecting with a buried contact region. Any such intersection with a buried contact region increases the defect density of the processed wafer.

The double polysilicon configuration creates a further yield problem because the additional layer of polysilicon requires creating an additional layer of silicon dioxide to isolate the polysilicon layer from whatever layer the polysilicon is adjacent to. This results in more process stages or steps. The increase of steps in the fabrication process has an inverse impact on the yield of the silicon wafer.

OBJECTS OF THE INVENTION

A general object of the invention is to produce a memory cell configuration for static MOS RAMs which is reduced in size as compared to the conventional, single polysilicon configuration.

Another object of the invention is to reduce the number of process steps and interconnect levels, thereby increasing the yield of a processed wafer, as compared to the typical, double polysilicon configuration.

BRIEF DESCRIPTION OF THE DRAWINGS

The above objects and further objects of the invention will be realized more particularly from the description of the preferred embodiment and from the accompanying drawings, of which:

FIGS. 3a-3d are cross-section, elevational views of the cell of FIG. 1, including the insulation region and the subsstrate, taken along the lines a—a, b—b, c—c, and d—d, respectively.

SUMMARY OF THE INVENTION

The invention overcomes the disadvantages of the prior art by providing a single, polysilicon configuration for static MOS RAMs wherein three different types of conductive layers or regions are utilized to form the circuitry of each memory cell. The regions are isolated from each other, except for circuitry interconnections, by an insulation region. A first conductive region of N+ type silicon is formed in selected portions of the substrate to create the buried ground line and the source region and the drain regions of the transistors of the memory cell. A second conductive region of polysilicon is formed above the first region to create the word line, the gate regions of the transistors, the load resistors, and the power supply line of the memory cell. A metal region is formed above the first and second conductivity regions to create a pair of parallel data lines. The size of the memory cell is reduced because the buried ground line is directly below and oriented to run parallel to the power supply line portion of the polysilicon region. In addition, the number of process steps and interconnect levels is reduced by the use of a single polysilicon layer or region. As a result, the yield per silicon wafer is enhanced.

DETAILED DESCRIPTION OF THE INVENTION

Figure 1:
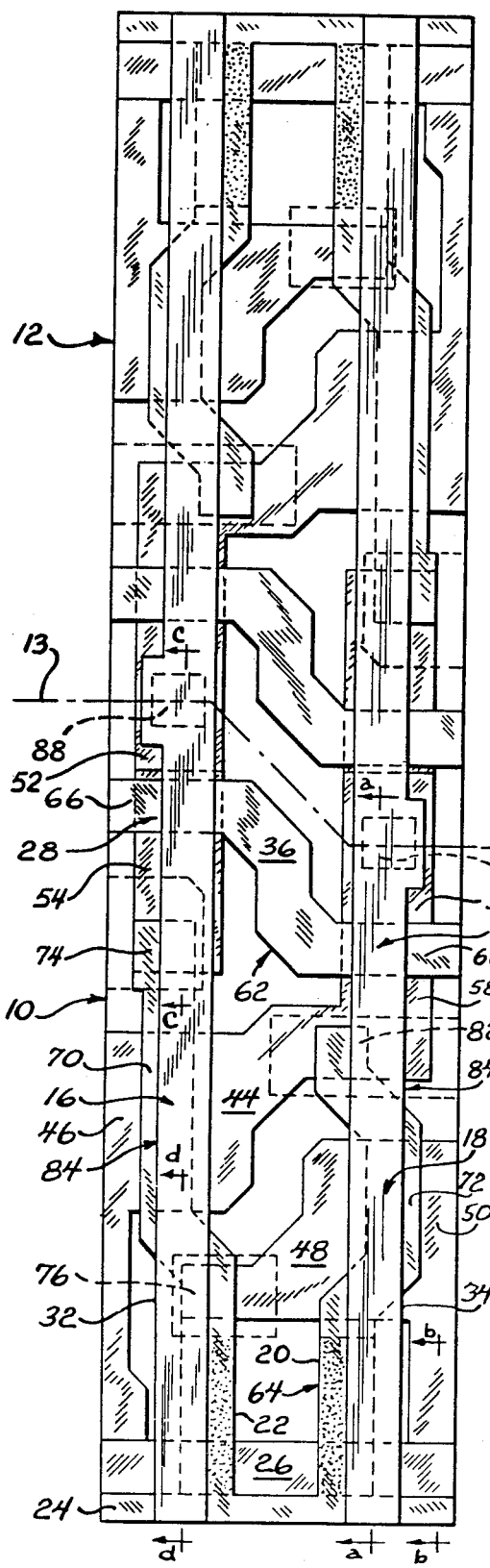
FIG. 1 is an enlarged plan view of a pair of shared memory cells from a static memory array on a semiconductor chip illustrating only the three conductive regions therein.

Referring to FIG. 1, a pair of static RAM cells 10 and 12 from a static memory array depict the preferred embodiment of the invention. For purposes of illustration, the cells 10 and 12 are separated by a dotted line 13 in FIG. 1. Also, only the conductive regions and contacts of the two cells are shown. Contact oxide cuts are shown by the dotted boxes in FIG. 1. Each memory cell in the static memory array shares common elements or components with adjacent memory cells. The manner in which components are shared will be discussed in more detail later in the description.

Figure 2:
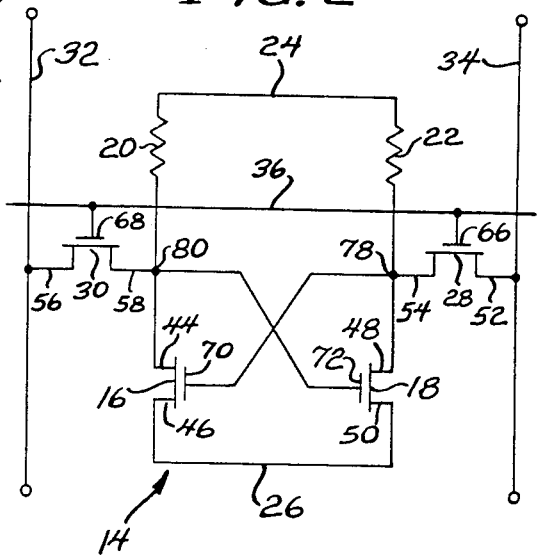
FIG. 2 is an electrical schematic diagram of one of the cells of FIG. 1.

FIG. 2 illustrates the electrical circuitry of cell 10. The cell includes a standard flip-flop 14 arranged from a pair of cross-coupled driver transistors 16 and 18, a pair of load resistors 20 and 22, a power supply or Vcc line 24, and a ground or Vss line 26. A pair of transfer transistors 28 and 30 are coupled to the flip-flop 14 and arranged in conjunction with a pair of data lines 32 and 34 and a word line 36 for accessing data in the flip-flop 14. The components of cell 10 are fabricated on or on top of a substrate 38 of semiconductor material and are isolated from each other, except for electrical connections, by an insulation region 40, as shown in FIGS. 3a-3d, which is preferably silicon dioxide.

Figure 3A:
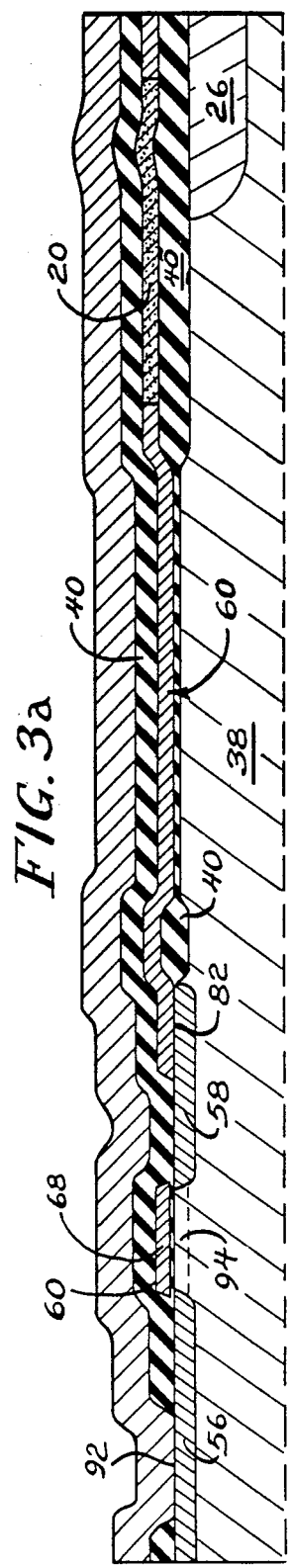
Figure 3B:
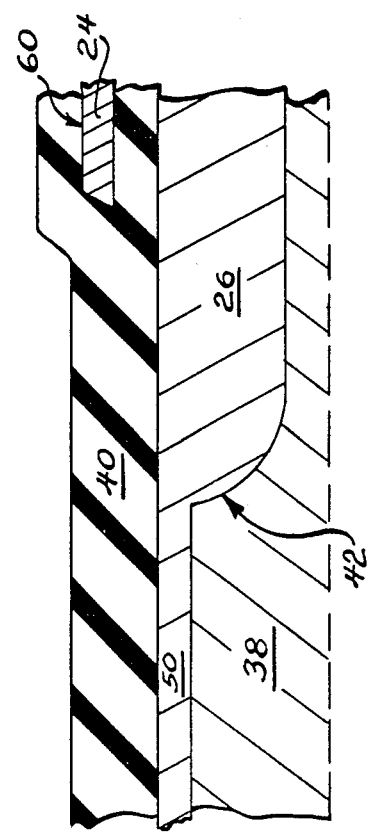

Referring to FIGS. 1 and 3a-3d, an N+ region 42 in the P— substrate 38 creates first a conductivity region for forming the buried ground line 26 and the drain regions 44, 48, 52, and 56 and the source regions 46, 50, 54, and 58 of the transistors 16, 18, 28, and 30, respectively. As shown in FIGS. 3a, b, and d, the buried ground line 26 is a thicker N+ layer than the drain and source regions 44–58 because the ground line is doped with phosphorus, whereas the drain and the source regions are doped with arsenic. The source regions 46 and 50 of the driver transistors 16 and 18 overlap or are connected to the buried ground line 26. Otherwise, the buried ground line is isolated from the remainder of the cell 10 by insulation region 40.

A polycrystalline silicon region 60 is formed within insulation region 40 and above N+ region 42 to provide a second conductivity region. The polysilicon region is separated into portions 62 and 64. The word line 36 and the gate regions 66 and 68 of transfer transistors 28 and 30, respectively, share the common portion 62. The separated portion 64 delineates the gate regions 70 and 72 of driver transistors 16 and 18, respectively, as well as load resistors 20 and 22 and the Vcc line 24. Valuable space in the cell 10 is saved because the Vcc line 24 is oriented directly above and parallel to the buried Vss line 26. The gate regions 70 and 72 are respectively connected to one end of load resistors 20 and 22. The other ends of load resistors 20 and 22 are adjacent and perpendicular to Vcc line 24. The load resistors 20 and 22 maintain high resistivity characteristics as they are formed from a lighter doped polysilicon area in the portion 64.

The source region 54 of transfer transistor 28 is connected to the gate region 70 of driver transistor 16 at contact area 74. Similarly, the gate region 70 of driver transistor 16 is connected to the drain region 48 of driver transistor 18 at contact area 76. As a result, connection 78 (See FIG. 2) is formed between the source region 54 of the transfer transistor 28, the gate region 70 of the driver transistor 16, and the drain region 48 of driver transistor 18. A corresponding connection 80 (See FIG. 2) is formed at contact area 82 between the source region 58 of transfer transistor 30, the gate region 72 of driver transistor 18 and the drain region 44 of driver transistor 16.

An aluminum region 84 having dopants therein such as silicon and copper is formed on the top surface of the insulation region 40 above both the N+ diffusion region 42 and the polysilicon region to delineate the data lines 32 and 34. Each data line forms a connection with a corresponding drain region of a transfer transistor. One connection 86 is created at contact area 88 where data line 32 penetrates the insulation region 40 to the drain region 52 of transfer transistor 28. The other connection 90 is created at contact area 92 where data line 34 penetrates the insulation region 40 to the drain region 56 of transfer transistor 30. The contact areas 88 and 92 or, alternatively, the connections 86 and 90 are commonly shared by the adjacent memory cell 12.

A process for making a preferred embodiment of the single polysilicon cell 10, as described above, will now be discussed. A slice of P− type, monocrystalline semiconductor silicon material is used as the substrate 38. The single cell structure which is fabricated on the wafer represents only a very small portion of the wafer area. Initially, the wafer is covered with a silicon nitride layer (not shown). Then certain areas of the silicon nitride layer are etched off. Thereafter, a layer of insulation material is conventionally grown on the regions of the substrate not blocked by the silicon nitride. Subsequently, the remaining portions of silicon nitride are etched off. Now, the formation of the memory cell begins. First, a buried ground line 26 is implanted into the P− wafer by doping a non-oxidized portion of the substrate with N+ type impurities. Thereafter, enhancement implanting occurs in the substrate 38 below the future gate regions and between the future drain regions and the future source regions of the soon to be enhancement mode transistors 16, 18, 28, and 30. Thin layers at these specific regions in the substrate are P+ type doped to insure better on and off characteristics for the enhancement mode transistors. Enhancement layers 94 and 96 are respectively shown in FIGS. 3a and 3c for transistors 30 and 28. The enhancement layers are not shown for transistors 16 and 18.

In the next step of the process, a layer of insulation material is deposited over the entire wafer. Subsequently, portions of the insulation material are etched off in order to expose contact areas 74, 76, and 82 on future source region 54, future drain region 48, and future source and drain regions 58 and 44, respectively.

In the following step, a layer of polycrystalline silicon is deposited onto the surface of the wafer. As a result, the contact areas 74, 76, and 82 are covered. Thereafter, certain areas of the polysilicon layer are N-type doped. Subsequently, a mask is utilized in etching off portions of the polysilicon layer to form gate regions, interconnects, and load resistor regions.

Next, the drain regions and the source regions of the driver transistors 16 and 18 and transfer transistors 28 and 30 are implanted into second portions of the substrate. The source regions 46 and 50 of the driver transistors 16 and 18 are implanted in such a manner as to overlap with the buried Vss line 26. The remaining polysilicon layer is concurrently N type doped except for the load resistor regions which block the N type doping with a resistor mask.

The process is continued by depositing another layer of insulation material. It should be noted at this point, that the total of deposited silicon dioxide layers combine to form a homogenous insulation region which encloses the polysilicon layer therein except at the contact areas 74, 76, and 82. In the next step, portions of the insulation material are etched off down to contact areas 88 and 92 on the drain regions 52 and 54 of the transfer transistors 28 and 30. Thereafter, a metal layer of aluminum is deposited over the entire wafer so as to be connected to the drain regions 52 and 54 of the transfer transistors 28 and 32. In a final step, aluminum is etched off portions of the metal layer to delineate a pair of data lines connected to contact areas 88 and 92. This completes the fabrication of the memory cell. However, a passivation oxide (not shown) may be deposited over the wafer as a protection barrier.

In the above description, specific details of an embodiment of the invention have been provided for a thorough understanding of the inventive concepts. It will be understood by those skilled in the art that many of these details may be varied without departing from the spirit and scope of the invention.

What is claimed is:

1. A method for fabricating a bistable flip-flop memory cell having a pair of transfer transistors and a pair of driver transistors on a wafer of semiconductor material, including the steps of:

doping to form a buried ground line beneath the surface of substrate portion of the wafer;

depositing only a single layer of polycrystalline silicon ("poly") on the wafer crossing over conductive regions in the substrate;

establishing insulation between the polysilicon and a metal layer to be established subsequently; and establishing metal data lines for the memory cell.

2. The method of claim 1 including delineating, in said single layer of poly, a word line and a pair of resistors separated from the substrate by a non-conductive region or layer.

3. The method of claim 1 including delineating, in said single layer of poly, a word line, a power supply line and a pair of resistors.

4. The method of claim 3 wherein said power supply line crosses over a conductive region in the substrate.

5. The method of claim 4 including:

etching, prior to depositing said layer of poly, to expose first contact surfaces on the intended source and drain regions for contact with said poly;

delineating the poly so that said power supply line is located above and oriented parallel to said buried ground line, and so that said poly also forms gate electrodes of the transistors;

doping source and drain regions of the transistors;

etching to expose second contact surfaces on the drain regions; and wherein said metal data lines are connected to said second contact surfaces.

6. The method of claim 5 wherein said buried ground line overlaps source regions of driver transistors.

7. The method of claim 5 wherein said etching step to expose first contact surfaces exposes said surfaces on the drain regions of the driver transistors and the source regions of the transfer transistors.

8. The method of claim 7 wherein said etching step to expose second contact surfaces exposes said surfaces on the drain regions of the transfer transistors.

* * * * *

REEXAMINATION CERTIFICATE (798th)
United States Patent [19]
Hardee

[11] B1 4,486,944
[45] Certificate Issued  Dec. 15, 1987

[54] METHOD OF MAKING SINGLE POLY MEMORY CELL

[75] Inventor: Kim C. Hardee, Manitou Springs, Colo.

[73] Assignee: Inmos Corporation, Colorado Springs, Colo.

Reexamination Request:
No. 90/001,107, Oct. 3, 1986

Reexamination Certificate for:
Patent No.: 4,486,944
Issued: Dec. 11, 1984
Appl. No.: 485,732
Filed: Apr. 18, 1983

Related U.S. Application Data

[62] Division of Ser. No. 164,285, Jun. 20, 1980.

[51] Int. Cl.⁴ .......................................... H01L 21/80
[52] U.S. Cl. .......................................... 437/52; 437/60

[56] References Cited
U.S. PATENT DOCUMENTS

| | | | |
|---|---|---|---|
| 4,125,854 | 11/1978 | McKenny et al. | 357/41 |
| 4,208,781 | 6/1980 | Rao et al. | 29/577 C |
| 4,214,917 | 7/1980 | Clark et al. | 148/1.5 |
| 4,223,333 | 9/1980 | Masuoka | 357/41 |
| 4,234,889 | 11/1980 | Raymond, Jr. et al. | 357/71 |
| 4,246,592 | 1/1981 | Bartlett | 357/41 |
| 4,247,915 | 1/1981 | Bartlett | 365/154 |
| 4,322,824 | 3/1982 | Allan | 365/185 |

Primary Examiner—Brian E. Hearn

[57] ABSTRACT

A single polycrystalline silicon configuration for a memory cell in a static MOS RAM and a method of fabricating the same are described. Three conductivity regions are utilized to form each memory cell. A first conductivity region is formed in the substrate to create a buried ground line and sources and drains of transistors. A second conductivity region is formed within an insulation layer and above the first conductivity region to create a word line, gate regions of the transistors, load resistors, and a power supply line. The power supply line is oriented directly above and parallel to the ground line. A third conductivity region is formed on the surface of the insulation layer to create data lines. The number of process steps and the size of the memory cell are reduced by this configuration.

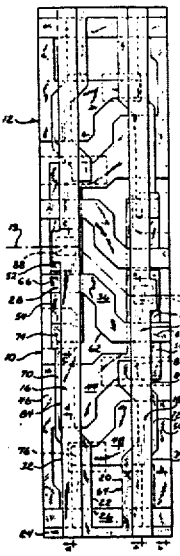

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claim 3 is cancelled.

Claims 1, 2, 4 and 5 are determined to be patentable as amended.

Claims 6-8, dependent on an amended claim, are determined to be patentable.

New claims 9-13 are added and determined to be patentable.

1. A method for fabricating a *static RAM* bistable flip-flop memory cell having a pair of transfer transistors and a pair of driver transistors on a wafer of semiconductor material, including the steps of:
   doping to form a buried ground line beneath the surface of a substrate portion of the wafer;
   *establishing a layer of insulation over said wafer; and after said doping and establishing steps, then*
   depositing only a single layer of polycrystalline silicon ("poly") on the wafer crossing over *said* conductive regions in the substrate; *thereafter*
   *doping and etching said poly layer to delineate a power supply line over said ground line, a word line, and a pair of load resistors in said single poly layer; thereafter*
   establishing insulation between the [polysilicon] *poly layer* and a metal layer to be established subsequently; and *thereafter*
   establishing metal data lines for the memory cell *said data lines being formed over said ground line and said power supply line.*

2. The method of claim 1 [including delineating, in said single layer of poly, a word line and a pair of resistors] *wherein said single layer of poly, said word line, and said resistors are not* separated from the substrate *except* by a non-conductive region or layer.

4. The method of claim [3] *2* wherein said power supply line crosses over a conductive region in the substrate.

5. The method of claim 4 including:
   etching *said insulation*, prior to depositing said layer of poly, to expose first contact surfaces on the intended source and drain regions for contact with said poly;
   delineating the poly so that said power supply line is located above and oriented parallel to said buried ground line, and so that said poly also forms gate electrodes of the transistors;
   doping source and drain regions of the transistors;
   etching to expose second contact surfaces on the drain regions; and
   wherein said metal data lines are connected to said second contact surfaces.

9. *The method of claim 1 wherein said resistors extend in a direction perpendicular to the orientation of said power supply line.*

10. *A method for fabricating a static RAM bistable flip-flop memory cell having a pair of transfer transistors and a pair of driver transistors on a wafer of semiconductor material, including the steps of:*
    *doping the substrate to form a buried ground line beneath the surface of a substrate portion of the wafer; then*
    *establishing a layer of insulation over the wafer and defining said insulation to form first insulation regions; then*
    *depositing only a single layer of polycrystalline silicon ("poly") on the wafer crossing over said conductive regions in the substrate;*
    *doping areas of said single poly layer;*
    *defining said single poly layer to form gate regions, interconnects, and load resistor regions;*
    *said defining said poly layer step further including defining a power supply line oriented parallel to said buried ground line, and defining a word line; then*
    *doping source and drain regions of both said transfer transistors and said drive transistors while blocking said load resistor regions with a resistor mask;*
    *establishing a second layer of insulation over said poly; then*
    *establishing a metal layer over said second insulation layer, and defining said metal layer to establish data lines for the memory cell;*
    *said step of defining the metal layer including defining said data lines perpendicular to said buried ground line and said power supply line.*

11. *The method of claim 10 further including:*
    *etching said insulation, prior to depositing said single layer of poly, to expose first contact surfaces on the intended source and drain regions for contact with said poly; and*
    *etching to expose second contact surfaces on said drain regions, said etching step occurring after said step of doping source and drain regions.*

12. *The method according to claim 10 wherein said step of doping to form a buried ground line comprises implanting impurities into said region.*

13. *The method according to claim 10 wherein said step of doping source and drain regions includes doping source drain regions of said driver transistors in such a manner to overlap with said buried ground line.*

* * * * *